(12) United States Patent
Jairazbhoy

(10) Patent No.: US 6,361,606 B1
(45) Date of Patent: Mar. 26, 2002

(54) METHOD AND APPARATUS FOR DISPENSING VISCOUS MATERIAL

(75) Inventor: Vivek Amir Jairazbhoy, Farmington Hills, MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 0 days.

(21) Appl. No.: 09/359,282

(22) Filed: Jul. 22, 1999

(51) Int. Cl.⁷ ................................................ B05C 3/02
(52) U.S. Cl. ..................... 118/410; 118/413; 118/693
(58) Field of Search ........................ 222/386.5, 389; 118/410, 693, 694, 413

(56) References Cited

U.S. PATENT DOCUMENTS

| | | | |
|---|---|---|---|
| 1,911,094 A | * | 5/1933 | Skoglund |
| 4,622,239 A | | 11/1986 | Schoenthaler et al. |
| 4,720,402 A | | 1/1988 | Wojcik |
| 5,133,120 A | | 7/1992 | Kawakami et al. |
| 5,191,709 A | | 3/1993 | Kawakami et al. |

* cited by examiner

Primary Examiner—Brenda A. Lamb
(74) Attorney, Agent, or Firm—Visteon Global Technologies, Inc

(57) ABSTRACT

A novel apparatus for compressing viscous material through openings in a stencil is disclosed. The novel apparatus has a compression head cap which provides a contained environment to direct and to aid the flow of pressurized viscous material through the openings in the stencil. In another embodiment of the invention, the compression head includes a selectively expandable diaphragm and viscous material reception and dispensation apertures. The viscous material reception aperture is formed in close proximity to the material dispensation aperture and this aperture placement to allow the viscous material to be selectively dispensed with a substantially uniform velocity and pressure profile. In another embodiment, the compression head includes a selectively expandable diaphragm which further increases the uniformity of the velocity and pressure profiles.

14 Claims, 7 Drawing Sheets

METHOD AND APPARATUS FOR DISPENSING VISCOUS MATERIAL

FIELD OF THE INVENTION

Embodiments of the present invention relate generally to methods and devices for depositing viscous materials onto a printed wiring board. In one aspect, the present invention relates to methods and devices for compressing viscous materials, such as solder paste, through openings in a perforated substrate, such as a patterned screen or stencil.

DESCRIPTION OF RELATED ART

Surface Mount Technology (SMT) involves placing circuit components onto circuit paths embedded on the upper surface of a printed wiring board and then soldering the components in place by a process called "reflow soldering". Before the circuit component is placed on the printed wiring board, however, it is desirable to apply solder paste to the area on the printed wiring board where the component is to be soldered into place.

Conventional methods do exist to deposit ("print") solder paste onto desired areas of a printed wiring board by forcing the paste through openings in a substrate (e.g., a stencil) placed in intimate contact with the printed wiring board.

U.S. Pat. No. 4,622,239 describes such a method and device for dispensing viscous materials. The method includes forcing a viscous material from a housing through an opening and depositing it onto a stencil between a pair of flexible members (parallel squeegee blades) which depend from the housing on either side of the opening and are in contact with the stencil. The ends of the flexible members are not connected and remain open ended. The viscous material, accordingly, is not contained within an enclosed area when it is deposited on the surface of the stencil. Movement of the housing and the flexible members horizontally across the stencil causes the trailing flexible member to force the viscous material through the openings in the stencil. U.S. Pat. No. 4,720,402 describes a similar method and device except that the leading flexible member is raised off of the stencil during movement of the housing.

U.S. Pat. Nos. 5,133,120 and 5,191,709 describe methods for filling through-holes of a printed wiring board via a mask with pressurized conductive filler material by means of a nozzle assembly unit having a nozzle tip member. The nozzle tip member, however, is designed only to dispense the pressurized conductive filler material through the mask to a single through-hole. The nozzle tip member then "scans" the printed wiring board for a second through-hole to fill. The nozzle tip member has a blunt end section which rests on the mask and a circular exit, the diameter of which may be increased or decreased by changing the nozzle tip member. The nozzle tip member dispenses the filler material without controlling unwanted flow of "excessive" filler material back through the stencil. Additionally, the nozzle tip member does not define a contained environment where "compression" of the filler material takes place through the mask followed by the immediate shearing off of the filler material within that contained environment from the surface of the stencil. In fact, the nozzle tip member itself provides no effective means for shearing off filler material from the top of the stencil, rather, after the through hole is filled and filler material "backs up" through the stencil, the nozzle tip member moves forward whereupon the "excessive" filler material is then wiped off by a separate, single, flexible squeegee member which is designed for unidirectional use only.

Unfortunately, these conventional efforts do not provide a contained environment for compression of viscous material through holes in a stencil and shearing of viscous material within the contained environment from the upper surface of the stencil. Reliance upon squeegee movement to force the viscous material, such as solder paste, through the stencil openings can lead to damage and eventual failure of both the squeegee blades and the stencil due to repeated friction. Since conventional efforts do not provide a contained environment in which compression and shearing is accomplished, waste of the viscous material is frequently encountered.

Conventional efforts, therefore, (1) fail to maximize the efficiency of printing solder paste onto a desired area of a printed wiring board and (2) fail to minimize waste of the solder paste during the printing process. A need therefore exists to develop a method for printing solder paste onto a printed wiring board and a device suitable for use therewith which overcomes the deficiencies of the conventional efforts.

Other methods and assemblies utilize a pneumatically driven piston assembly which typically resides upon the compression head and which typically includes a container having a certain amount of viscous material and at least one piston which is selectively and movably deployed within the container and which is effective to cause a certain amount of the contained viscous material to be selectively dispensed and communicated to the compression head.

These prior assemblies and methodologies suffer from at least several drawbacks. First, the piston-viscous material containment assemblies are relatively heavy and bulky, thereby requiring undesirable and relatively costly structural or "support-type" modifications be made to the existing compression head assembly. These pneumatically driven piston assemblies are also relatively difficult to service and undesirably interrupt the printing process each time that maintenance is performed upon them or additional viscous material is added to the container. Moreover, these prior piston-viscous material containment assemblies usually inject or communicate at least a portion of the contained viscous material into a top portion of the head. The communicated viscous material is typically made to traverse through the compression head and is made to exit at or through a bottom portion or viscous material dispensation aperture which is typically and integrally formed within the compression head.

This arrangement typically causes the velocity of the emitted or exiting viscous material to be non-uniform and to have a substantially non-uniform velocity profile. That is, the velocity of the viscous material which exits the aperture and which enters the stencil perforations is non-uniform and varying. The exiting viscous material therefore provides or has a non-uniform velocity profile. Moreover, that portion of the dispensed viscous material, which encounters a solid or non-perforated portion of the stencil, such as a "paste-filled" hole, causes a certain amount of "backpressure" to be created within the compression head and/or within or through the dispensation aperture. The created "backpressure" is substantially non-uniform and varies from location to location within the compression head and varies from location to location within or through the viscous material dispensation aperture. The selectively dispensed viscous material thereby provides or has a non-uniform pressure profile.

Particularly, most of the received viscous material flows through a path or paths which is (are) substantially and axially aligned with the material reception aperture or that location through which the viscous material is communicated into the compression head. This flow pattern is due to the fact that this path or (these paths) has (have) a relatively lower flow resistance than other flow paths which are not substantially aligned with (are remotely positioned from) the material reception aperture. Accordingly, material traversing this path (or paths) exits the compression head at a substantially higher velocity than the material flowing through the various other paths. It is this dissimilarity in flow resistance which causes the viscous material to be dispensed into the stencil perforations at velocities which vary from "location to location" within the material dispensation aperture, thereby forming a substantially non-uniform velocity dispensation profile (e.g., the "velocity dispensation profile" or "velocity profile" comprises the velocity values associated with the viscous material which is communicated to the stencil perforations through various locations within the material dispensation aperture). Similarly, this prior arrangement further causes the creation of non-uniform pressure profiles (e.g., the pressure "profile" comprises the values of the "backpressure", at various locations within the material dispensation aperture, which is created by the viscous material). These non-uniform pressure and velocity profiles cause different amounts of viscous material to be placed upon the various portions of the stencil surface. This non-uniform material distribution thereby causes the creation of unacceptably poor quality circuit boards and further causes a waste of the viscous material.

The present invention is directed to overcoming some or all of the previously delineated drawbacks while allowing for the selective emission or dispensation of viscous material having a substantially uniform pressure and velocity profile, while reducing the amount of printing and/or circuit creation interruptions during the circuit board printing process, and providing a compression head assembly which may be easily serviced and maintained.

SUMMARY OF THE INVENTION

The present invention includes a novel apparatus and method for dispensing viscous material through openings in a stencil. Embodiments of the present invention include a process herein referred to as "compression printing" wherein pressure is applied to a viscous material within a contained environment defined by a compression head cap so as to compress it through openings in a stencil.

The apparatus of the present invention includes a reservoir containing viscous material which is operably connected to a pressure source. The reservoir is in fluid communication with a housing which terminates in a substantially uniform opening defined by a compression head cap formed from contiguous walls. During operation of the apparatus, the compression head cap is placed in contact with a stencil having a plurality of openings therein. The compression head cap and the stencil form a contained environment. The pressure source then applies pressure against the viscous material contained in the reservoir forcing it from the reservoir into the housing and to the compression head cap. The contiguous walls of the compression head cap act to contain and to direct flow of the pressurized viscous material to the top surface of the stencil and then through the openings in the stencil.

It is accordingly an object of the present invention to provide a novel apparatus for compressing a viscous material through openings in a stencil by means of a pressure source. It is a further object of the present invention to increase the efficiency of printing viscous material onto a desired area of a printed wiring board and to minimize waste of the viscous material during the printing process.

According to one aspect of the invention a viscous material dispensing apparatus is provided. The dispensing apparatus includes a compression head which selectively receives and dispenses viscous material. The compression head has a dispensation aperture through which the viscous material is selectively dispensed, a viscous material reception aperture through which the viscous material is selectively received, and a selectively expandable diaphragm which causes the received viscous material to dispensably exit the compression head through the dispensation aperture.

According to yet another aspect of the invention a viscous material dispensing assembly is provided. The assembly includes a container of viscous material, the container having an aperture which allows the contained viscous material to selectively exit the container, and a compression head having a top portion which includes a selectively expandable diaphragm, a side portion which communicates with the aperture of the container and which allows the viscous material to flow into the compression head in a first direction, and a bottom portion which includes a material dispensation aperture, the diaphragm being selectively movable in a second direction which is substantially perpendicular to the first direction and being effective to selectively cause the received viscous material to dispensably exit the compression head through the dispensation aperture.

According to a further aspect of the invention a method of dispensing viscous material is provided. Particularly, the method includes the steps of providing a head having a dispensation aperture, communicating the viscous material to the head, providing a selectively expandable diaphragm within the head, and selectively expanding the diaphragm, thereby causing the received viscous material to be selectively dispensed through the dispensation aperture.

Other objects, features and advantages of the present invention will become apparent from the following description taken in conjunction with the accompanying drawings.

BRIEF DESCRIPTION OF THE DRAWINGS

In the course of the detailed description of certain preferred embodiments to follow, reference will be made to the attached drawings, in which.

DESCRIPTION OF CERTAIN PREFERRED EMBODIMENTS

The principles of the present invention may be applied with particular advantage to obtain an apparatus for compressing a viscous material through openings in a stencil, preferred embodiments of which may be seen at FIGS. 1, 2, 3, 4, and 5 which are described more fully below.

Figure 1:
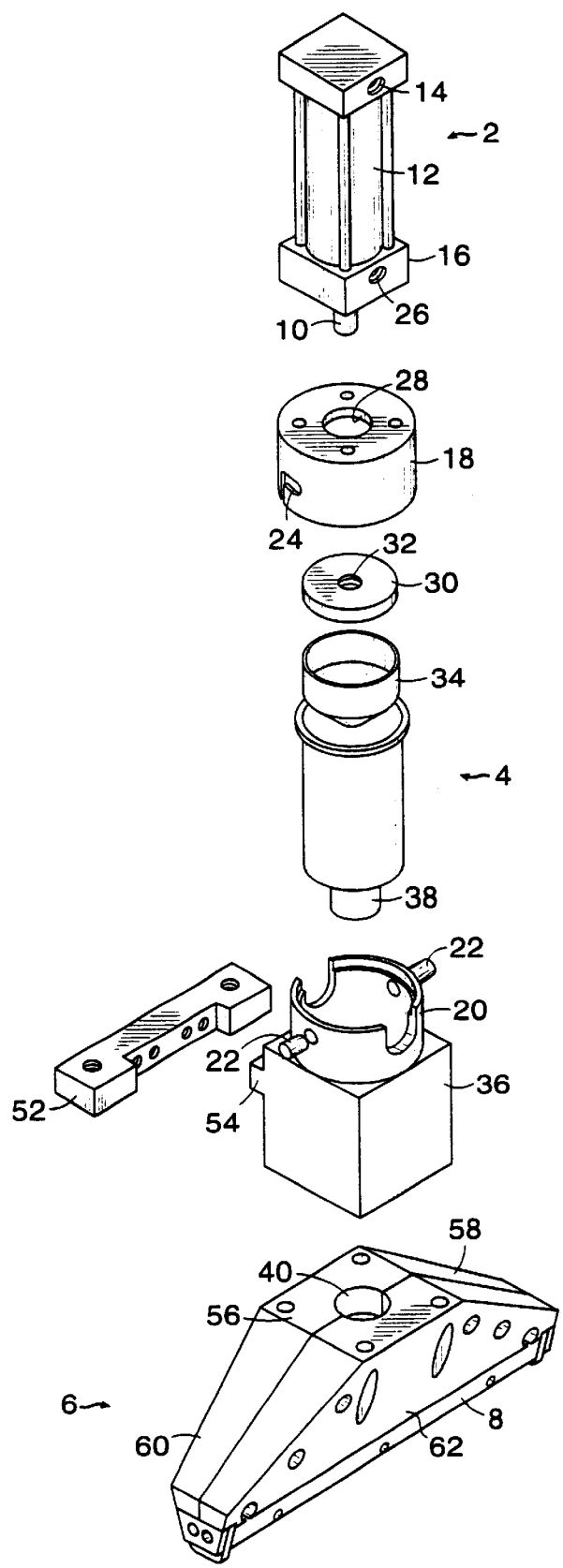
FIG. 1 is a perspective view of the apparatus of the present invention, partially exploded.

FIG. 1 is a partially exploded perspective view of one embodiment of the apparatus of the present invention. As can be generally seen at FIG. 1, the apparatus has a pressure source 2 which is operably connected to a reservoir 4 containing a supply of a viscous material, a compression head 6 and a compression head cap 8.

More particularly, FIG. 1 shows a pressure source depicted as an air cylinder 2 having a piston (not shown) connected to a rod 10 contained in a cylinder housing 12. Pressure inlet 14 allows for the introduction of air pressure at the top of air cylinder 2 thereby displacing the piston causing piston rod 10 to move downward. The air cylinder 2 is mounted via base 16 to cylinder mount 18 which in turn is removably mounted to casing 20 via a twist socket connector having posts 22 and socket grooves, one of which is shown at 24. Base 16 has air inlet 26 for the introduction of air pressure at the bottom of air cylinder 2 thereby displacing the piston causing piston rod 10 to move upward.

Piston rod 10 extends through opening 28 of cylinder mount 18 and is fixedly connected to syringe pusher 30 at contact 32 which in turn engages displacement piece 34 which is movably disposed within syringe 4 which contains a viscous material. Displacement piece 34 acts as a plunger and is designed to mate with the interior of syringe 4 to ensure effective displacement of viscous material with minimal waste. Pressure source 2 is designed to mechanically meter out viscous material through operation of the syringe pusher 30 on the displacement piece 34. The syringe pusher 30, displacement piece 34 and syringe 4 are all vertically housed in operative fashion within the cylinder mount 18, the casing 20 and the syringe housing 36.

The vertical arrangement of the pressure source 2 and the syringe 4 containing the viscous material is a preferred arrangement which advantageously provides for even and direct pressure in metering out the viscous material onto the top surface of a stencil. It is to be understood that pressure source 2 is not limited to an air cylinder of the type depicted in FIG. 1, but that other suitable pressure sources may be used by one of ordinary skill in the art based upon the teachings of the present invention. Such pressure sources include those which mechanically, electrically, or hydraulically operate a mechanical force, such as a piston rod and displacement piece, to meter out viscous material from a syringe housing or other reservoir which contains viscous material. In addition, pneumatic pressure may be used directly to force viscous material from a reservoir housing. Also, pressure source and reservoir configurations other than the vertical configuration depicted in FIG. 1 are useful in the present invention. Such configurations include side mounted reservoirs and pressure sources or other configurations readily known to those skilled in the art.

The syringe 4 is preferably a disposable unit which can be replaced when desired by disconnecting cylinder mount 18 from casing 20 via the twist socket connector, removing the syringe and replacing it with an alternate syringe. Examples of disposable syringes useful within the teachings of the present invention include those which are readily commercially available from Methods Engineering, Vauxhall, N.J. The cartridges may be purchased prefilled with suitable viscous materials or they may be purchased empty and then filled with suitable viscous materials, such as solder pastes, which are useful within the practice of the present invention. Useful solder pastes may be readily commercially available from Alpha Metals, Jersey City, N.J.

Typical solder pastes useful with surface mount technology generally contain an alloy of tin, lead and silver in various proportions in combination with other useful solder paste metals, viscosity agents, flux and/or solvents depending upon the desired use of the solder paste. Solder pastes useful in the present invention will become apparent to one of ordinary skill in the art based upon the teachings herein.

Figure 2:
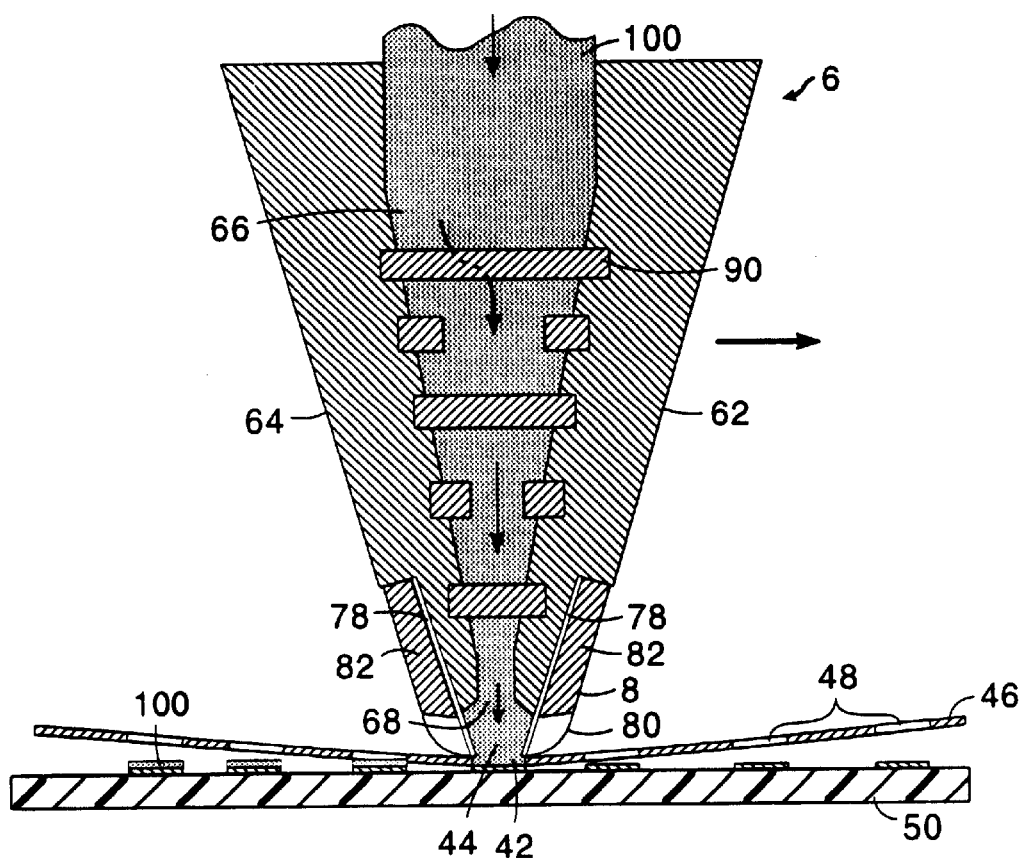
FIG. 2 is a side cross-sectional view of a compression head, a compression head cap, a stencil and a printed wiring board of the present invention showing movement of the solder paste through the compression head, the compression head cap and the openings of the stencil onto the printed wiring board.

The syringe housing 36 is mounted to a housing referred to herein as a compression head generally depicted at 6 in FIG. 1 and shown in a cross-sectional side view in FIG. 2. The syringe 4 has flange opening 38 which is inserted into and mates with first opening 40 of compression head 6 which is described hereafter with reference to both FIGS. 1 and 2 and FIG. 3 which is a bottom perspective view of the compression head cap 8, partially broken away. The compression head 6 terminates in a substantially uniform second opening 42 which is defined by compression head cap 8. The compression head cap 8 is formed from contiguous walls which define a volume 44 within compression head cap 8. The contiguous walls may be either unitary or formed from separate elements and are designed to contact stencil 46 to provide a uniform and substantially flush union with stencil 46 at the point of contact. As can be seen in FIG. 2, stencil 46 has openings 48 and is placed in an operable relationship with a printed wiring board 50. The stencil 46 may be placed in intimate contact with printed wiring board 50 or, as shown in FIG. 2, it may be placed a distance above printed wiring board 50 such that pressure from the compression head 6 forces the stencil 46 into contact with printed wiring board 50. Although stencil 46 is shown in cross-section, it is to be understood that openings 48 may have any desired orientation on stencil 46. Further openings 48 may differ in size depending upon the area of the printed wiring board 50 to be printed with the viscous material. The compression head cap 8 and stencil 46 together form a contained environment 44 for the viscous material during operation of the apparatus of the present invention.

As can be seen in FIG. 1, cross bar mount 52 is attached to syringe housing 36 via flange 54. Cross bar mount 52 is also attached to a mechanism (not shown) for horizontally displacing the apparatus of the present invention along the stencil 46.

The compression head 6 is preferably formed from metal, such as iron or stainless steel or other material suitable for use with pressurized viscous material. The compression head 6 has top surface 56 which serves as the base to which the syringe housing 36 is attached. Side surfaces 58 and 60 extending from top surface 56 slope away from each other as depicted in FIG. 1 to define an increasing length of compression head 6. Front and back surfaces 62 and 64 are contiguous with side surfaces 58 and 60 and slope toward each other as depicted in FIG. 2 to define a decreasing width of compression head 6. The side surfaces join with the front and back surfaces to define a tapered interior chamber 66 as shown in FIG. 2 which acts to restrict flow of viscous material through compression head 6. Interior chamber 66 terminates in generally rectangular exit 68. Compression head 6 preferably acts as a nozzle to direct and constrict the flow of viscous material through generally rectangular exit 68. The compression head cap 6 defines a volume 44 surrounding the rectangular exit 68 and into which viscous material flows after exiting the interior chamber 66 of compression head 6. As shown in FIG. 2, the volume 44 is preferably a separate chamber into which the viscous material flows after exiting the interior chamber 66 via rectangular exit 68. The compression head cap 8 defines a generally rectangular opening 42 which is to be contacted with stencil 48. The compression head cap 8 acts to contain and direct the flow of viscous material to the stencil 46. In an alternate embodiment, it is to be understood that the interior chamber 66 may terminate directly into compression head cap 8 without the need for rectangular exit 68 or volume 44.

Figure 3:
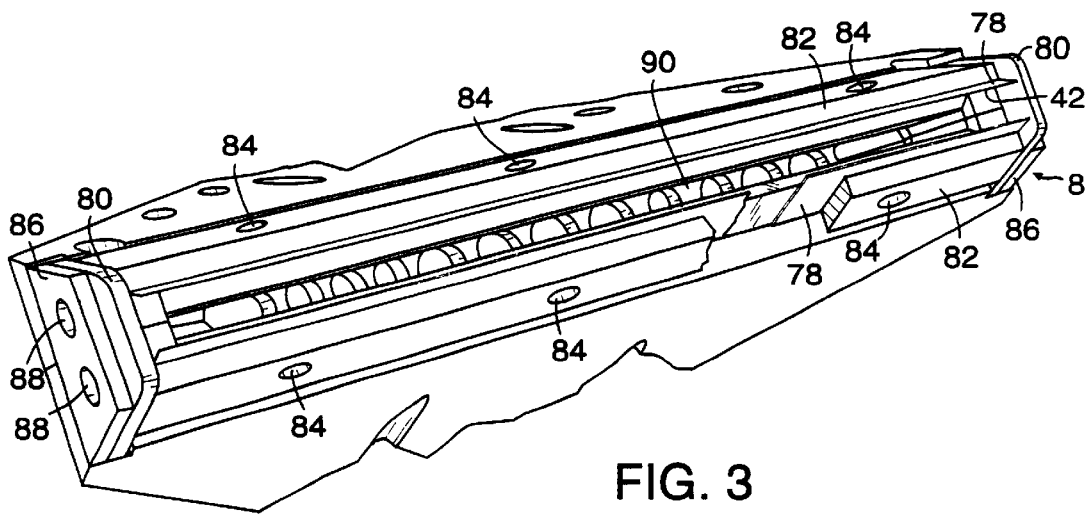
FIG. 3 is a bottom perspective view of the compression head cap of the present invention, partially broken away.
Figure 4:
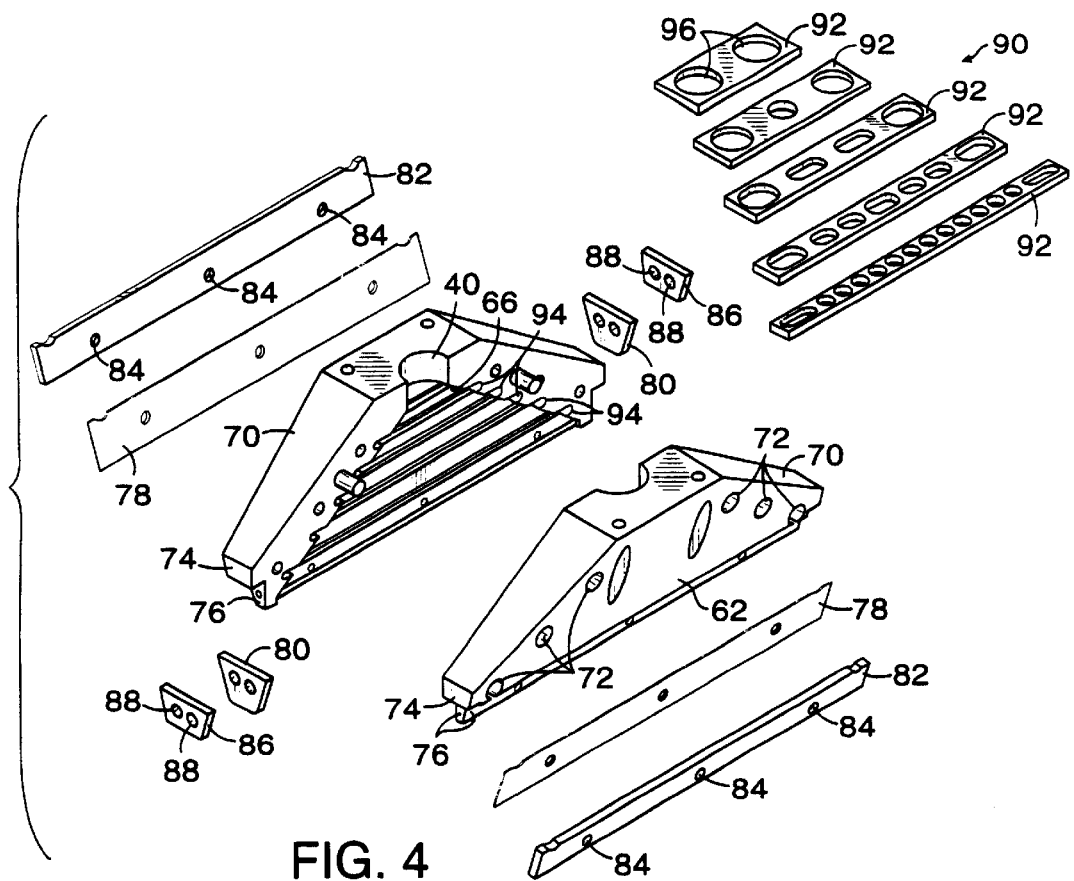
FIG. 4 is an exploded perspective view of the compression head of the present invention showing components of the compression head cap and one embodiment of a diffuser of the present invention.

As can be seen in FIG. 4, the compression head 6 has two half sections 70 which are fixedly connected by screws (not shown) via screw holes 72. The bottom side section 74 of each half section 70 is provided with ledge area 76 to engage the compression head cap 8. As depicted in FIGS. 2, 3 and 4, compression head cap 8 has rectangular blades 78 and end caps 80, which define generally rectangular opening 42. Blades 78 are each fixedly mounted to a corresponding ledge area 76 of front surface 62 and back surface 64, respectively, by means of corresponding rectangular blade holders 82 and screws (not shown) via screw holes 84. Blades 78 each extend along substantially the entire length of corresponding ledge area 76. End caps 80 are attached to a corresponding ledge area 76 of bottom side section 74 via corresponding cap mounts 86 and screws (not shown) via screw holes 88. The end caps 80 are contiguous with blades 78 and together form the compression head cap 8. As can be seen more clearly in FIG. 2, blades 78 parallel the slope of corresponding front and back surfaces 62 and 64, and are, therefore, seen to be angled inward relative to the interior chamber 66 of compression head 8.

Blades 78 are preferably thin and formed from rigid material such as iron or stainless steel. End caps 80 are preferably formed from a flexible substance such as polyurethane to avoid damage to the stencil during operation of the apparatus of the present invention. Cap mounts 86 and blade holders 82 are formed from any solid material capable of securing the corresponding end cap or blade.

While the compression head cap 8 is depicted in FIGS. 2, 3, and 4 as being formed from integral parts, it is to be understood that compression head caps having a unitary structure are within the teachings of the present invention. Such unitary compression head caps are formed from a single rectangular shaped unit and are designed to encircle the ledge area 76 of the compression head 6 or otherwise operatively engage compression head 6. Such compression head caps may be either fixed or removably mounted to the compression head and may have various sizes of opening 42.

The compression head 6 and compression head cap 8, in combination with the pressure source 2 and syringe 4 advantageously provide a vertical down force to move the viscous material evenly and directly to the stencil. The compression head cap 8 of the present invention advantageously provides a contained environment to direct and to aid in the extruding of pressurized viscous material through openings in the stencil. The extruded viscous material is then deposited on the pattern of the printed wiring board. The apparatus of the present invention provides for very high speed printing capability while maintaining print definition and reduced cycle time. Waste of viscous material is minimized due to the contained environment provided by the compression head cap 8. The length of the compression head cap 8 allows for simultaneous compression printing through a plurality of openings 48 in stencil 46. Furthermore, the trailing blade 78 relative to the direction of operation advantageously operates to shear off the viscous material contacting the stencil within the compression head cap 8 when the apparatus of the present invention is horizontally disposed across the stencil. The blades 78 are rigid and angled to advantageously achieve a smooth shearing of the viscous material. The compression head 6 and compression head cap 8 are advantageously rectangular in shape so that they may operate over a significant area of the stencil with each pass. Additionally, given the dual blade design of the compression head cap 8, the apparatus of the present invention may operate in both the forward and reverse directions thereby improving the efficiency of the compression printing process of the present invention.

As can be further seen in FIGS. 2 and 4, compression head 6 has diffuser 90 which is fixedly mounted within interior chamber 66. Diffuser 90 has a plurality of diffuser plates 92 which are horizontally disposed within interior chamber 66 via grooves 94. Each diffuser plate 92 has a series of openings 96 through which viscous material is to flow. Each opening 96 may be either circular or oblong and decreases in average size as the diffuser plates progress from the first opening 40 to the compression head cap 8. The openings 96 also increase in number as the diffuser plates progress from the first opening 40 to the compression head cap 8. The diffuser 90 advantageously serves to break up the flow of viscous material and evenly and uniformly distribute it from side to side of the rectangular exit 42. The diffuser 90 may also serve to reduce the velocity of the viscous material flowing through the compression head and increase the static pressure of the viscous material which aids in the compression printing process.

Figure 5:
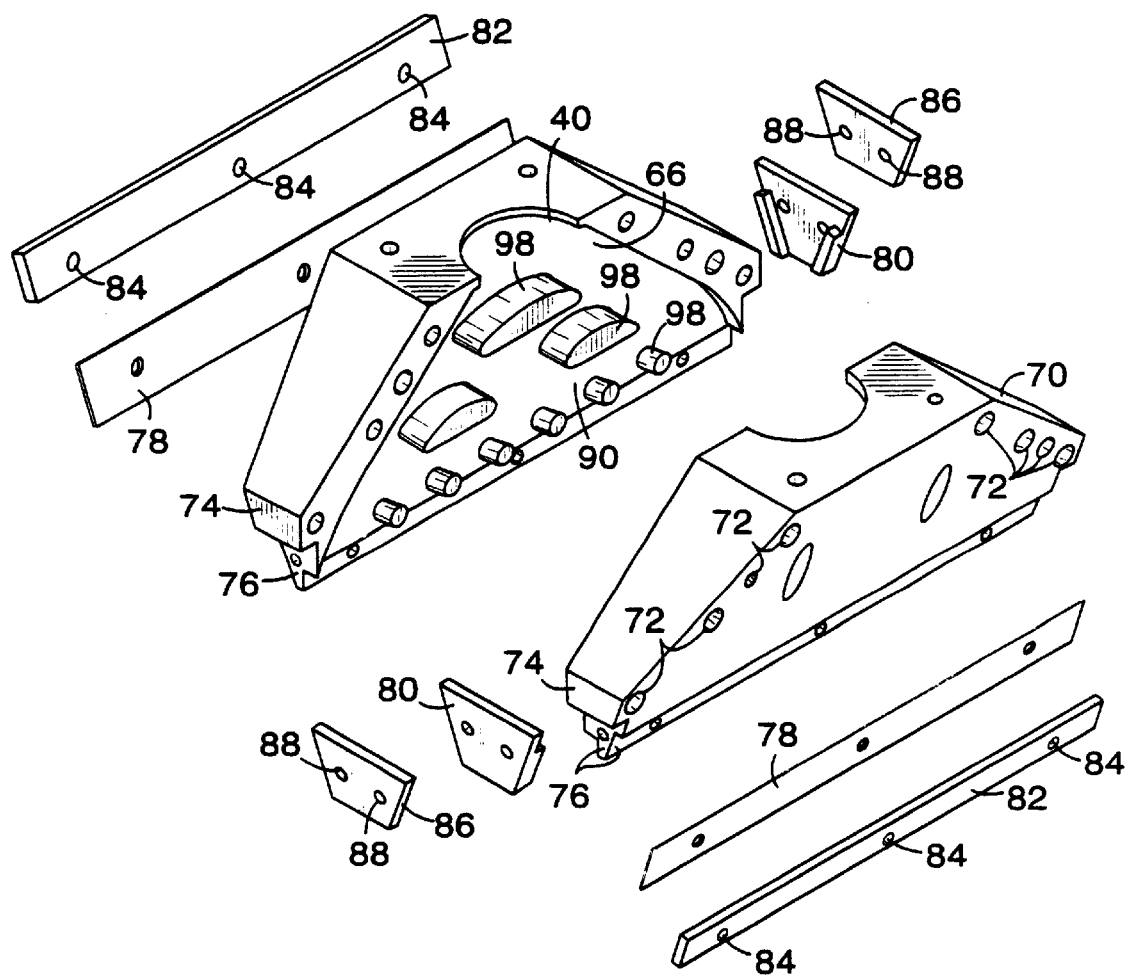
FIG. 5 is an exploded perspective view of the compression head of the present invention showing components of the compression head cap and a second embodiment of a diffuser of the present invention.

FIG. 5 shows an alternate embodiment of a diffuser 90 useful in the present invention. The diffuser 90 has a plurality of diffuser islands 98 which are horizontally disposed in rows within interior chamber 66. The diffuser islands 98 may be fixedly installed within the interior chamber 66 or they may be molded directly within the interior chamber 66. As with the diffuser 90 of FIG. 4, each diffuser island 98 acts to break up the flow of the viscous material and uniformly and evenly distribute it from side to side of rectangular exit 42. The diffuser islands may be either circular or oblong and decrease in average size as the rows progress from the first opening 40 to the compression head cap 8. The diffuser islands 98 also increase in number as the rows progress from the first opening 40 to the compression head cap 8. The diffuser islands 98 of the present invention are advantageous in that they provide for ease of fabrication of the compression head and ease of cleaning.

Operation of the apparatus of the present invention is now described as follows with reference to FIGS. 1 and 2. When compression printing according to the teachings of the present invention, the compression head cap 8 of the apparatus of the present invention is brought into contact with the top surface of stencil 46 which forces the stencil downward until it is in intimate contact with the printed wiring board below as shown in FIG. 2. The apparatus is then moved in a horizontal direction, as shown in FIG. 2, across the stencil 46.

During movement of the stencil, pressure source 2 acts on syringe 4 to force viscous material 100 from the syringe 4 into the interior chamber 66 of compression head 6 where it is diffused by diffuser 90 and directed to rectangular exit 68. The viscous material then enters volume 44 of compression head cap 8 which provides a contained environment via blades 78 and end caps 80 to direct the pressurized viscous material under pressure to the top surface of stencil 46. The viscous material is then extruded through openings 48 in the stencil 46 over which the compression head cap 8 travels. The extruded viscous material 100 is thereby printed on the printed wiring board 50. Movement of the compression head cap 8 across the stencil surface causes the trailing blade 78 which is angled inwardly relative to the interior chamber 66 to shear off the viscous material from the top surface of stencil 46. Once the apparatus has traversed the length of the stencil, the apparatus may simply reverse its direction and continue the compression printing process since the compression head cap 8 has dual blades 78 to accomplish the shearing process in either direction of movement.

Operating variables of the apparatus of the present invention, such as run speed and pressure, may be adjusted to accommodate either viscous materials having a wide range of viscosities or stencils with holes having a wide range of diameters. The following data in Table 1 is representative of the parameters at which the apparatus has successfully operated. Print speed is measures in inches per second, air pressure is measured in pounds per square inch, viscosity of the solder paste is measured in centipoises per second, stencil apertures are measured in inches, and the particle sizes of the solder pastes used are between 10–37 microns.

TABLE 1

| Print Speed (inches/sec.) | | Air Pressure (psi) | Viscosity (cps) | | Aperture (inches) | |
| --- | --- | --- | --- | --- | --- | --- |
| Low | High | | Low | High | Low | High |
| 0.94 | 1.26 | 20 | 850K | 1.0M | 0.0055 | >0.025 |
| 1.45 | 1.70 | 20 | 850K | 1.0M | 0.0055 | >0.025 |
| 2.27 | 2.31 | 20 | 850K | 1.0M | 0.0055 | >0.025 |
| 3.10 | 3.89 | 30 | 850K | 1.0M | 0.0055 | >0.025 |
| 4.20 | 4.77 | 30 | 850K | 1.0M | 0.0055 | >0.025 |
| 5.98 | 6.62 | 40–50 | 850K | 1.0M | 0.0075 | >0.025 |
| 6.69 | 7.23 | 50–60 | 850K | 1.0M | 0.0075 | >0.025 |
| 7.70 | 12.00 | 50–60 | 850K | 1.0M | 0.0075 | >0.025 |

As indicated by the above data, the apparatus of the present invention successfully operated over a wide range of print speeds, air pressures and stencil openings. The compression printing method disclosed herein advantageously provides for quicker print speeds, better quality of printing, and less waste of solder paste material than is encountered with conventional printing methods.

Figure 6:
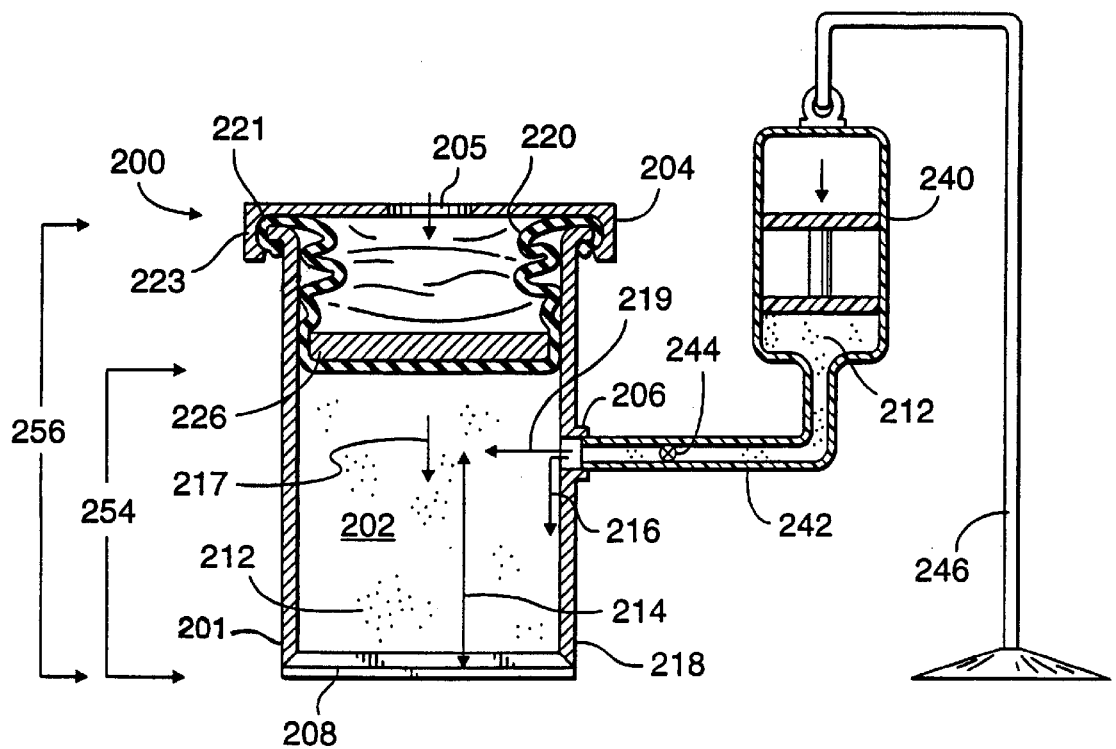
FIG. 6 is a cross-sectional view of a compression head which is made in accordance with the teachings of a second embodiment of the invention.
Figure 7:
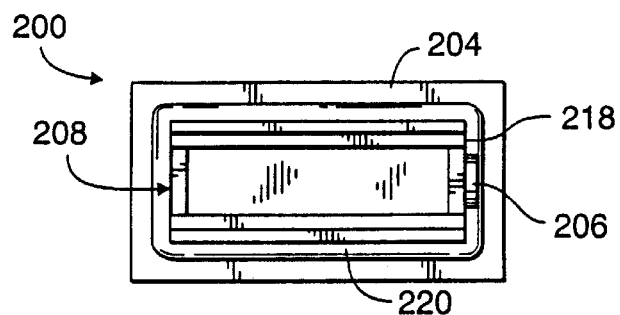
FIG. 7 is a bottom view of the compression head which is shown in FIG. 6.
Figure 8:
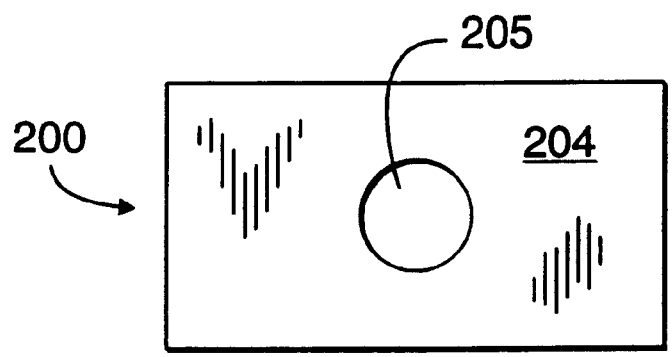
FIG. 8 is a top view of the compression head which is shown in FIG. 6.
Figure 9:
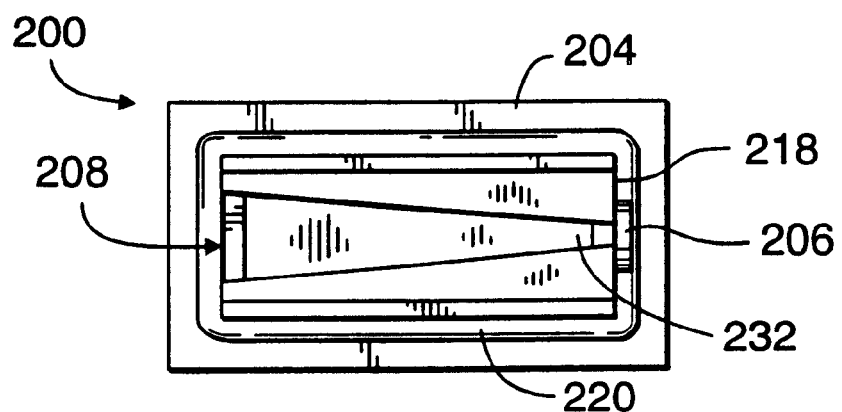
FIG. 9 is a bottom view of the compression head which is shown in FIG. 6 and which is made in accordance with the teachings of an alternate embodiment of the invention.

Referring now to FIGS. 6, 7, and 8, there is shown a compression head 200 which is made in accordance with the teachings of a second embodiment of the invention. As shown, the compression head 200 includes or forms a body 201 having a generally rectangular cross sectional area and containing a viscous material cavity 202 over which a substantially rectangular cap 204 selectively, snugly, and removably resides. It should be appreciated that body 201, cavity 202 and cap 204 may selectively comprise various other shapes, including and without limitation, a substantially circular, square, or and/or trapezoidal shape. Head 200 further includes or forms a viscous material reception aperture 206 which communicates with the cavity 202, and a viscous material dispensation aperture 208 which also communicates with the cavity 202.

In the preferred embodiment of the invention, viscous material reception aperture 206 is positioned and/or is formed upon and/or is integrally formed within compression head 200 in close proximity to the material dispensation aperture 208 and, more particularly, is formed within side wall 218. In one non-limiting embodiment, the term "in close proximity" is defined and "means" that apertures 206 and 208 are positioned upon the same bottom half of the head 200. In another non-limiting embodiment, this term "means" that apertures 206, 208 are formed upon the same surface of the compression head 200. In a first non-limiting embodiment, viscous material 212, contained within reservoir 240, selectively enters the chamber 202 through the flexible hollow tube 242 which is selectively and communicatively coupled to the aperture 206 by conventional securing techniques.

The close proximity of apertures 206 and 208, in one non-limiting embodiment, reduces the non-uniformity of the pressure and the velocity profiles of the dispensed viscous material 212 since this aperture placement allows the received viscous material 212 to traverse only a relatively short distance 214, within cavity 202, before exiting through the material dispensation aperture 208. This relatively short distance 214 substantially limits the amount of momentum which is gained or achieved by that portion of the material 212 which flows toward aperture 208 along or substantially along the path 216 of the least or of relatively low flow resistance (in this non-limiting embodiment, path 216 occurs very close to wall 218), and thereby limits or "caps" the amount by which this momentum may increase, thereby limiting the amount of non-uniformity or disparity of the pressure and the velocity profiles associated with the viscous material 212.

Compression head 200, in an alternate embodiment, further includes a selectively expandable diaphragm 220 which is inserted within the cavity 202 and which has an open top end 221 which is foldably secured upon lip portion 223 of the head 200, thereby forcing the open end of the diaphragm 220 to conform to the size and the shape of the lip 203. Diaphragm 220 is further fixedly secured to head 200 by the cap 204 which "captures" the diaphragm 220 against the lip portion 223. The cap 204 includes an aperture 205 which communicates with a source of gas or air (not shown) and allows the gas or air to be selectively communicated within and into the diaphragm 220. In this embodiment, the ratio of the distance 254 between the aperture 208 and the unexpanded diaphragm 220 and the length 256 of the compression head 200 is about ⅓ or less.

Upon receipt of the gas or air, diaphragm 220 selectively expands within the cavity 202, along a direction 217 which is generally and substantially perpendicular to the direction 219 in which the viscous material 212 enters the cavity 202. In this manner, the viscous material 212 which enters cavity 202 in a direction 219 which is generally parallel to the aperture 208 (e.g., is generally parallel to the longitudinal axis of symmetry of aperture 208 or is parallel to a plane containing aperture 208), is urged by diaphragm 220 toward the material dispensation aperture 208. Diaphragm 220 may comprise a rubber member. Diaphragm 220 may also selectively contain a relatively hard and generally rectangular plunger member 226 which is movably disposed within the cavity 202, and which allows diaphragm 220 to provide greater compression of the received viscous material 212.

Figure 10:
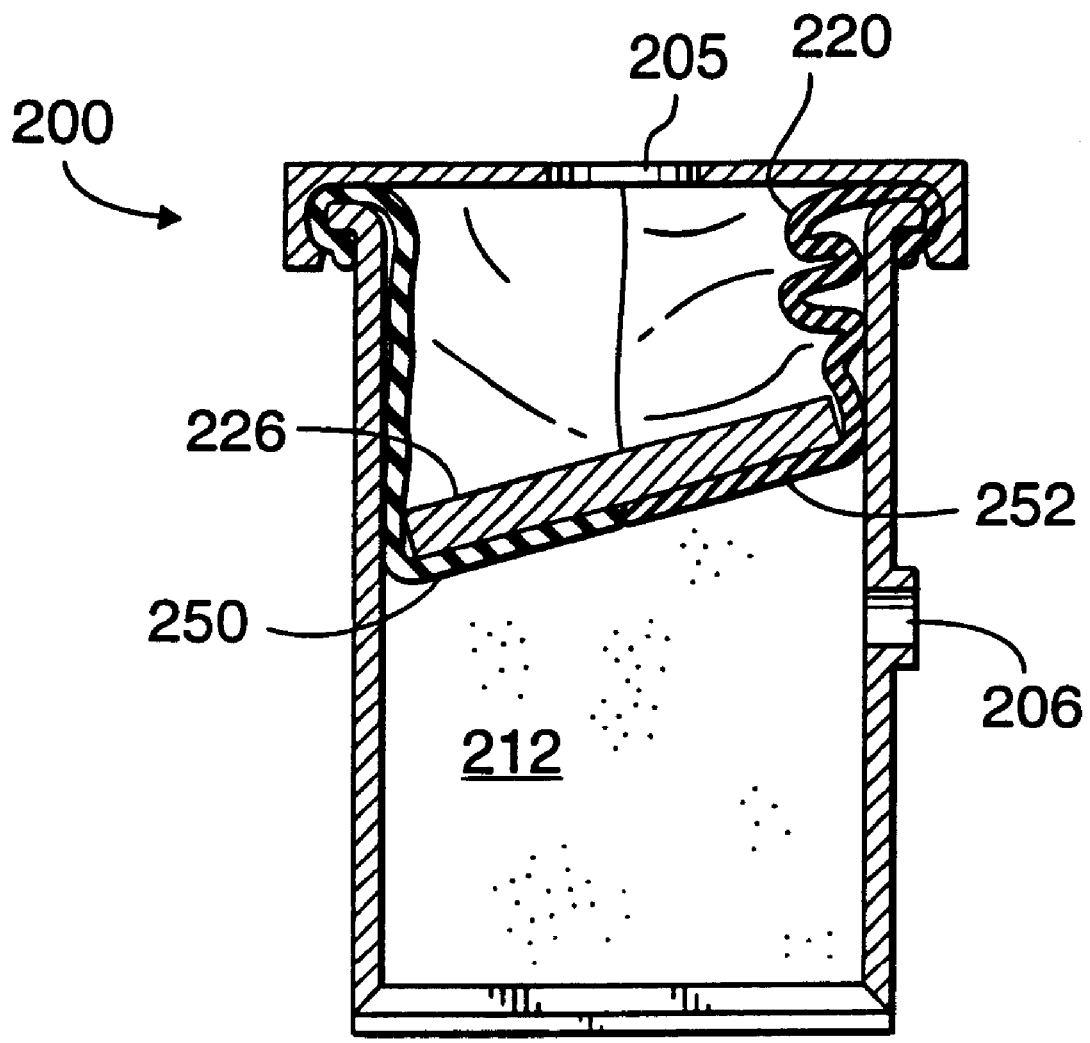
FIG. 10 is a view similar to that of FIG. 6 but illustrating the use of a selectively expandable diaphragm which is made in accordance with the teachings of an alternate embodiment of the invention.

The selectively expandable diaphragm 220 further increases the uniformity of the pressure and the velocity profiles associated with the received viscous material 212 by uniformly constricting or forcing the received viscous material 212 through the material dispensation aperture 208. In another non-limiting embodiment, shown best in FIG. 10, diaphragm 220 expands slowly along path 216 and much faster along the other flow paths, thereby increasing the velocity and the pressure of the material 212 resident within these other paths, and thereby further reducing the overall non-uniformity of the velocity and pressure profiles associated with the received viscous material 212. This function is achieved, in one non-limiting embodiment, by the use of a first readily expandable material 250 on one side of diaphragm 220 and a second stiffer material 252 on the second side of the diaphragm, above the path 216.

Moreover, as best shown in FIGS. 7 and 8, the aperture 208 may have a rectangular shape or a shape which has a constricted portion 232 below path 216, thereby further increasing the flow resistance of the path 216, and cooperating with the selectively expandable diaphragm to further increase the uniformity of the pressure and the velocity profiles of the selectively deposited and the dispensed viscous material 212. Further, in the most preferred embodiment of the invention, the shape of plunger 226 "mimics" or is substantially equivalent to the shape of the aperture 208 and is adapted, in yet another non-limiting embodiment, to selectively reside within the aperture 208 when the diaphragm has been fully and selectively expanded.

As further shown, in the most preferred embodiment of the invention, the viscous material container or reservoir assembly 240 is remotely positioned from the compression head 200 and is independently supported by stand assembly 246. Reservoir assembly 240 selectively communicates viscous material 212 to the material reception aperture 206 by use of the previously described flexible and generally hollow tube 242. The remote placement of the reservoir or viscous material container 240 allows the aperture 206 to be judiciously placed or formed within the head 200, thereby allowing the uniformity of the velocity and the pressure to be improved in the foregoing and previously delineated manner. The remote placement of the container 240 also obviates the need for structural modifications to be made to the compression head 200, allows for more efficient maintenance of the head 200, and allows viscous material 212 to be selectively added to the container 240 without interrupting the printing process and/or the operation of the compression head 200.

Solenoid 244 allows a user or a controller operating under stored program control (not shown) which is coupled or connected to solenoid 244, to selectively control the flow of material 212 into the compression head 200. In one non-limiting embodiment, solenoid 244 selectively allows the material 212 to enter the cavity 202 through tube 242. After a certain quantity of material 212 enters cavity 202, solenoid 244 prevents the flow of further material 212 into the cavity 202 and diaphragm 220 selectively expands, thereby urging the received viscous material 212 onto a stencil and circuit board. As the stencil is moved away from head 200, solenoid 244 allows additional material 212 to enter cavity 202 in preparation for the printing of a second stencil or circuit board. In this manner, printing is quickly accomplished. Further, as the material 212 within container 240 is depleted, additional material 212 may be added to reservoir assembly 240 without an interruption in the printing cycle. Further, since tube 242 is flexible, compression head 200 may be selectively moved in order to properly deposit viscous material 212 onto a stencil and circuit board, while container 240 remains substantially stationary. In another non-limiting embodiment, tube 242 is substantially rigid.

It is to be understood that the embodiments of the invention which have been described are merely illustrative of some applications of the principles of the invention. Numerous modifications may be made by those skilled in the art without departing from the true spirit and scope of the invention.

What is claimed is:

1. A compression head which selectively receives and dispenses viscous material, said compression head having a dispensation aperture through which said viscous material is dispensed, a viscous material reception aperture through which said viscous material is received, and a selectively expandable diaphragm which comprises a first material portion and second material portion, said first material portion expanding at a faster rate than said second portion and which urges said received viscous material to exit said compression head through said dispensation aperture.

2. The compression head of claim 1 wherein said material reception aperture is formed within said compression head in close proximity to said material dispensation aperture.

3. The compression head of claim 1 wherein said material reception aperture and said material dispensation aperture are formed upon the same surface of said compression head.

4. The compression head of claim 1 wherein said material dispensation aperture is rectangular.

5. The compression head of claim 1 wherein said material dispensation aperture has at least one constricted portion.

6. The compression head of claim 1 wherein said selectively expandable diaphragm has at least one portion having substantially the same shape as said dispensation aperture.

7. The compression head of claim 1 wherein said viscous material is emitted from said material dispensation aperture at a substantially uniform velocity.

8. The compression head of claim 1 wherein said received viscous material flows into said compression head in a direction which is substantially parallel to said dispensing aperture.

9. The compression head of claim 1 wherein said head has a certain height and said selectively expandable diaphragm and said dispensation aperture are separated by a certain distance, wherein the ratio of said certain distance to said certain height is less than one-third.

10. A viscous material dispensing assembly comprising:

a container of viscous material, said container having an aperture which allows said contained viscous material to selectively exit said container; and a compression head having a top portion which includes a selectively expandable diaphragm, a side portion which communicates with said aperture of said container and which allows said exiting viscous material to flow into said compression head in a first direction, and a bottom portion which includes a dispensation aperture, said selectively expandable diaphragm being selectively movable in a second direction which is substantially perpendicular to said first direction and being effective to urge said received viscous material to exit said compression head through said dispensation aperture.

11. The viscous material dispensing assembly of claim 10 wherein said dispensation aperture is rectangular.

12. The viscous material dispensing assembly of claim 10 wherein said dispensation aperture has at least one constricted portion.

13. The viscous material dispensing assembly of claim 10 further comprising at least one blade positioned in close proximity to said dispensation aperture.

14. The viscous material dispensing assembly of claim 10 further comprising a solenoid which is coupled to said material reception aperture and which selectively allows at least a portion of said viscous material exiting said container to be selectively received by said material reception aperture.

* * * * *